United States Patent [19]

Canteloup

[11] Patent Number: 5,748,296
[45] Date of Patent: May 5, 1998

[54] METHOD AND DEVICE FOR IN SITU QUANTIFICATION, BY REFLECTOMETRY, OF THE MORPHOLOGY OF A LOCALIZED REGION DURING ETCHING OF THE SURFACE LAYER OF A THIN-FILM STRUCTURE

[75] Inventor: Jean Canteloup, Monthlery, France

[73] Assignee: Sofie Instruments, Arpajon, France

[21] Appl. No.: 691,816

[22] Filed: Jul. 31, 1996

[30] Foreign Application Priority Data

Aug. 2, 1995 [FR] France .................. 95 09422

[51] Int. Cl.⁶ .................................. G01J 3/42
[52] U.S. Cl. .......................... 356/72; 356/328
[58] Field of Search .................. 356/72, 73, 445, 356/446, 326, 328, 381, 382; 152/626.1; 348/86

[56] References Cited

U.S. PATENT DOCUMENTS 4,988,198  1/1991  Kondo .................. 356/357
5,355,217  10/1994  Canteloup et al. .................. 356/357

FOREIGN PATENT DOCUMENTS 0 408 015 A3  1/1991  European Pat. Off. .
0 577 399 A2  1/1994  European Pat. Off. .
2 680 414  2/1993  France .

Primary Examiner—F. L. Evans
Attorney, Agent, or Firm—Beveridge, DeGrandi, Weilacher & Young, L.L.P.

[57] ABSTRACT

An illumination beam is sent onto a localized region of the surface layer of a thin-film structure which is being etched in a vacuum processing chamber. The reflective light beam is sent through a filter to the matrix sensor of a video camera, and to an optical disperser or an interference filter, a selection diaphragm, a fiber-optic cable, and an analysis slit at the input of the optical disperser or interference filter. A spectral analysis of the reflective light beam is performed to detect, by reflectometry, the transition of the following layer in a specific analysis region of the localized region.

12 Claims, 5 Drawing Sheets

METHOD AND DEVICE FOR IN SITU QUANTIFICATION, BY REFLECTOMETRY, OF THE MORPHOLOGY OF A LOCALIZED REGION DURING ETCHING OF THE SURFACE LAYER OF A THIN-FILM STRUCTURE

Method and device for in situ quantification, by reflectometry, of the morphology of a localized region during etching of the surface layer of a thin-film structure.

The present invention relates to a method for real-time monitoring of the morphology in a localized region of a surface layer on a thin-film structure, as well as to a device for implementing the method.

Among numerous possible applications of the invention, mention may be made of the real-time, in situ monitoring of the fabrication of microsystems, micromachines, microsensors or integrated circuits, for example monitoring the crossing of a layer during etching.

French Patent Application No. 2,680,414 (SOFIE) discloses a compact assembly for observations and simultaneous laser interferometric measurements making it possible to carry out in situ interferometric measurements from a stack of thin films placed in a vacuum processing chamber. The assembly comprises an observation camera with the optical axis of the objective in common for an illumination beam and for one or two laser beams for interferometric measurements.

The technique disclosed in this prior document performs well, in particular for monitoring the rate of growth or decrease of the surface layer of a thin-film structure. However, it suffers from some inadequacies. In particular, the illumination light beam filtered in front of the camera and the measurement laser beam do not exactly have the same wavelength, which creates an achromatism problem rendering simultaneous focusing of the two light beams possible only if the objectives are achromatic. Furthermore, this technique does not permit precise monitoring of the crossing of a layer during etching.

The object of the present invention is to propose an improved technique for overcoming the limitations of the aforementioned conventional techniques and to permit real-time, in situ monitoring of the morphology of a localized region of the surface layer on a thin-film structure.

A further object of the invention is to provide a monitoring device, implementing this particular technique, with very small bulk in order to allow it to be integrated in the preexisting equipment for the technique of vacuum fabrication of complex thin-film structures.

A further object of the invention is to provide a monitoring device whose signal-to-noise ratio is sufficient to allow subsequent exploitation of the data.

The method of the invention is intended for real-time, in situ monitoring of the morphology of a localized region during etching of the surface layer of a thin-film structure. The thin-film structure is enclosed in a vacuum chamber provided with a transparent port or observation window.

The method of the invention consists in:
sending an illumination light beam of predetermined spectrum onto the localized region, the beam following an optical path centred on the optical axis of the objective of a video camera and passing through the window of the processing chamber to reach the localized region;
sending the light beam reflected by the localized region, which follows the said optical path, on the one hand to the matrix sensor of the video camera through a filter whose characteristic wavelength is chosen so as to eliminate the effect on the light signal of the sources present in the chamber other than the illumination light beam or to accentuate the effect on the signal of a light intensity modification by the sources present in the chamber and, on the other hand, to an optical disperser or interference filter, respectively and successively through a selection diaphragm and a fibre-optic cable;
performing, with the aid of the optical disperser or of the interference filter, a spectral analysis of the reflected light beam with a view to detecting the transition to the following layer, during etching, by reflectometry in a specific analysis region forming part of the localized region.

The input slit of the monochromator is designed on the basis of the characteristics of the monochromator, of the diameters and arrangement of the transmission optical fibres and of the aperture of the selection diaphragm.

Spectral analysis of the reflected beam makes it possible to obtain detection of the crossing of a layer during etching in the observed region, by virtue of the difference in reflectivity of the materials of the various layers. The detection may depend on the smallest of the wavelengths in the spectrum of the illumination light beam. It is possible to choose an illumination beam spectrum in which the smallest of its wavelengths is shifted to the ultraviolet.

However, the objective of the observation camera is made from optical lenses which have good optical characteristics in the visible-light spectrum, but poor characteristics in the ultraviolet-light spectrum. Shifting the illumination spectrum to the ultraviolet wavelengths is therefore not permitted beyond a certain optical limit of the objective used. The invention makes it possible, in this case, to create a parallel optical circuit with the aid of an additional module which will be described hereafter.

According to the invention, a wavelength band in the spectrum of the illumination light beam is chosen and the change in the light intensity as a function of time is examined by reflectometry. In this way, the crossing of a surface layer of the sample can be detected with precision, in particular during the plasma etching process.

The combination of spectral analysis and reflectometry therefore allows real-time detection of a discontinuity in the thin-film structure, that is to say the crossing of a layer during etching.

The invention will be more clearly understood on studying the detailed description of two embodiments, taken entirely without limitation and illustrated by the appended drawings, in which.

Figure 3A:
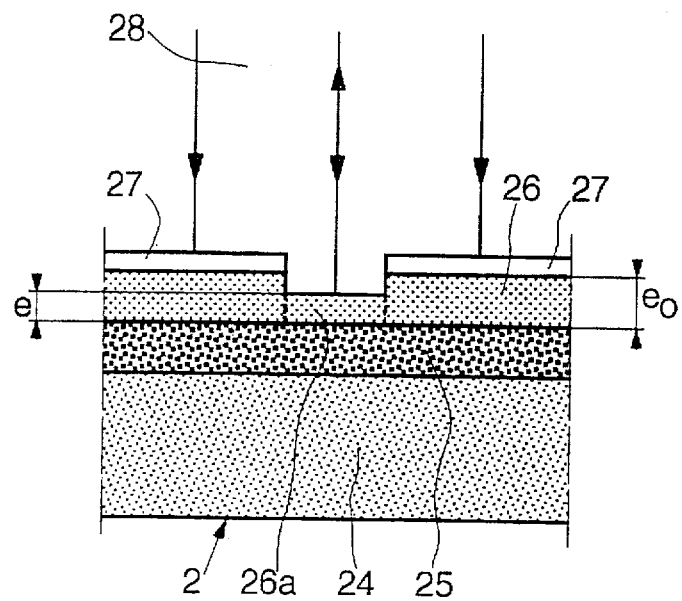
Figure 3B:
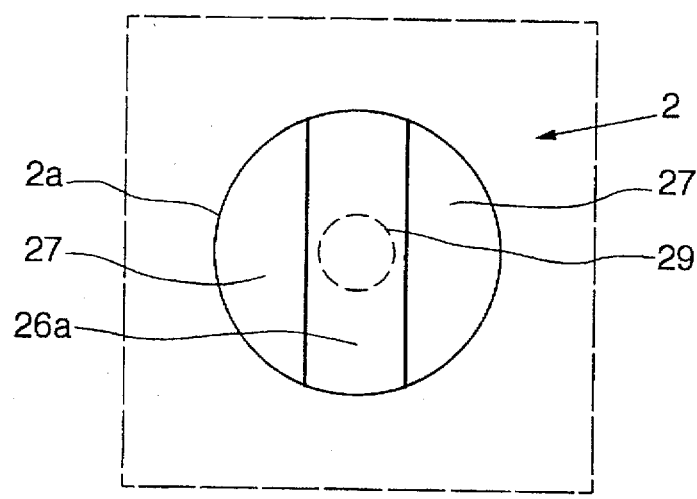
Figure 3C:
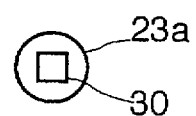
Figure 4:
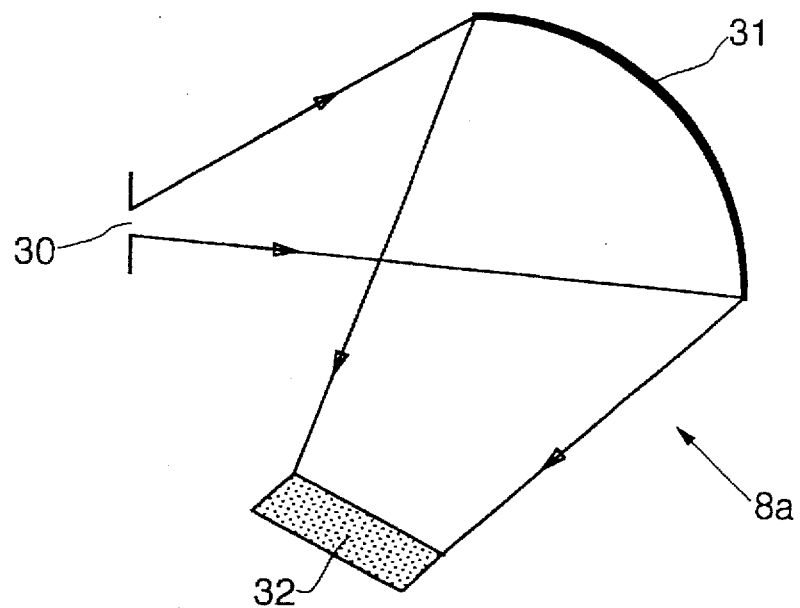
Figure 5:
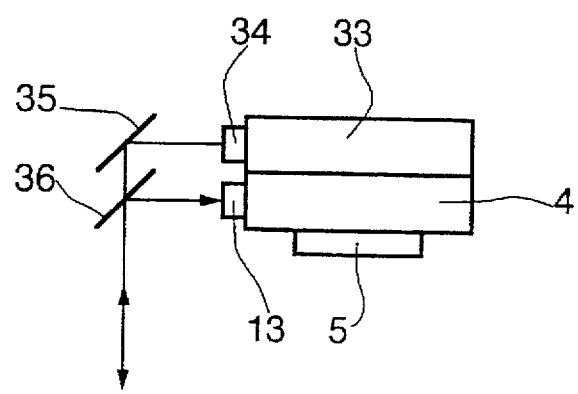

FIGS. 3a and 3b schematically show detailed views of the localized region of the sample monitored according to the technique of the invention;

FIG. 3c schematically shows the arrangement of the representative images of the invention;

FIG. 4 shows the operating principle of the monochromator;

FIG. 5 schematically shows a variant of the device of the invention; and

Figure 6:
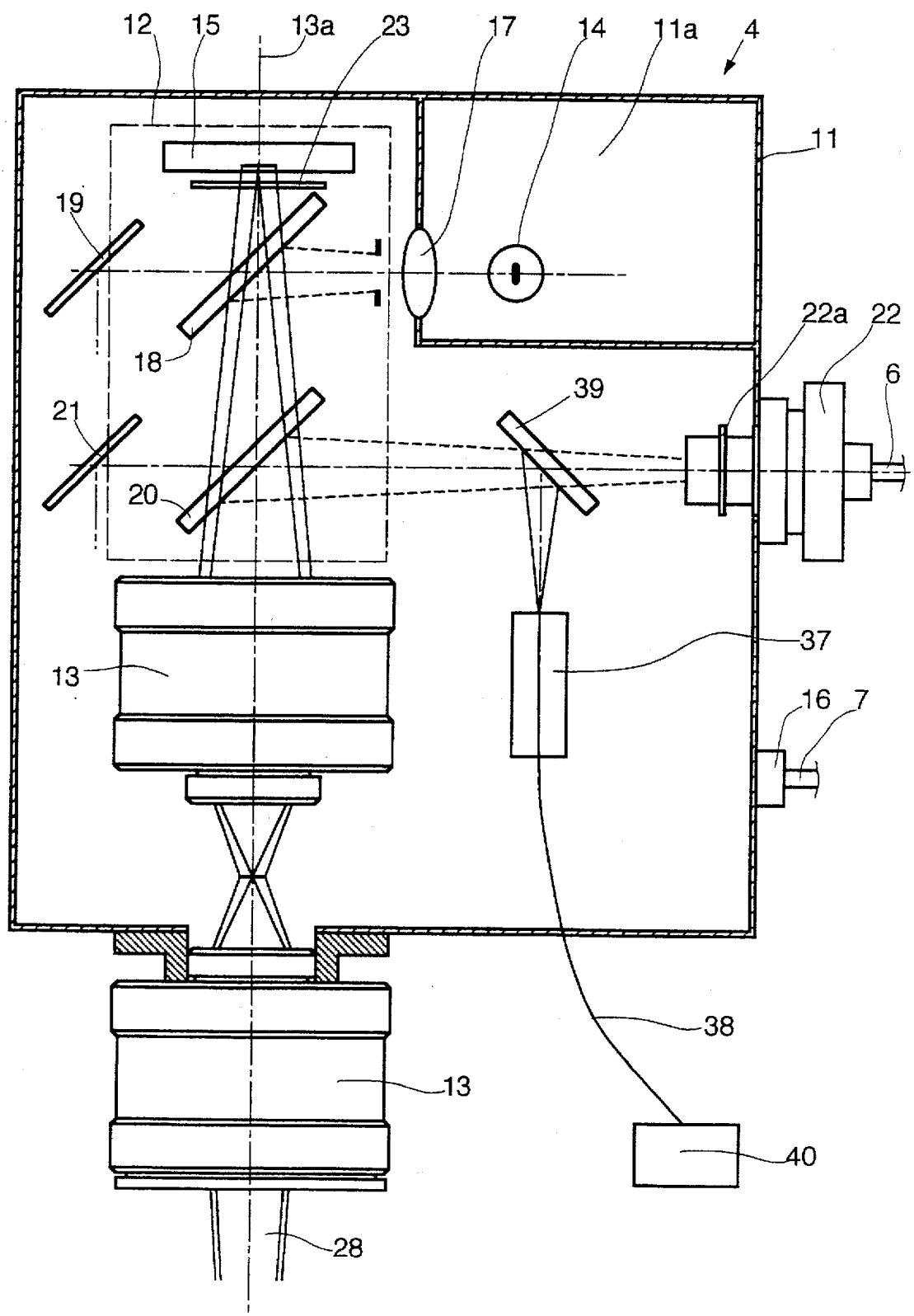

FIG. 6 is a diagram explaining the device of the second embodiment of the invention.

Figure 1:
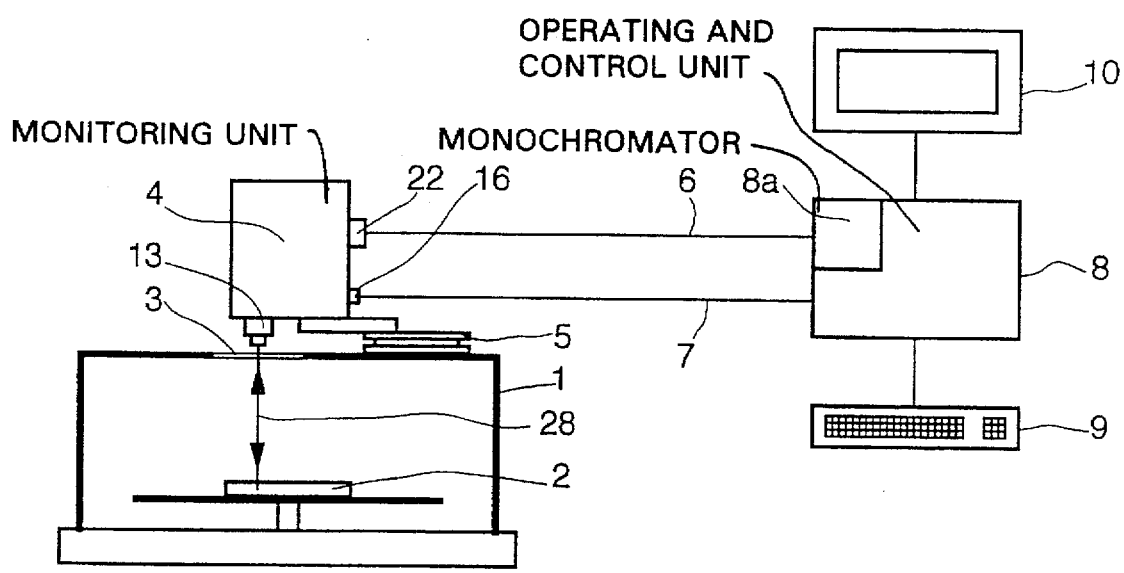
FIG. 1 is a diagram explaining the apparatus used in a particular application of the method of the invention.

As shown in FIG. 1, a processing chamber 1, in which a sample 2 to be processed is arranged, for example an integrated circuit wafer which is being etched, includes a silica window 3 on its upper wall. A measurement observation unit 4 is mounted, by means of an X-Y displacement table 5, on the top of the chamber 1. The unit 4 is connected by an optical fibre 6 and by a cable 7 to an operating and control unit 8 with which a keyboard 9, on the one hand, and a display screen 10, on the other hand, are associated. The unit 8 is connected to two stepper electric motors (not represented) for allowing the monitoring unit 4 to be displaced horizontally on the table 5.

Figure 2:
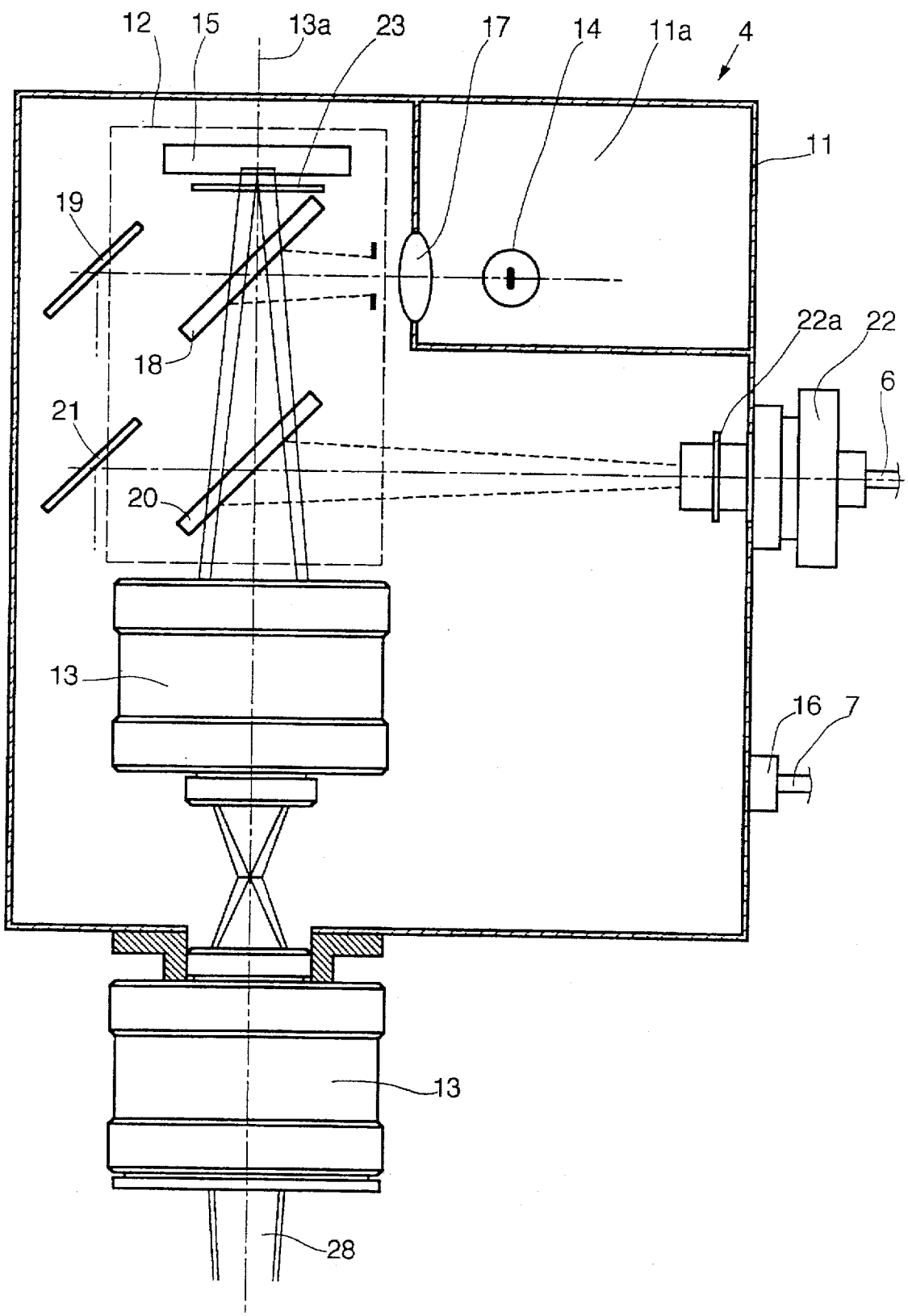
FIG. 2 is a diagram explaining the device of the invention.

As illustrated in more detail in FIG. 2, the monitoring unit 4 has a casing 11 which contains a video camera 12, the adjustable objective 13 of which may be of the autofocus type, an illumination source 14 and a number of optical plates for guiding the light beams along the predetermined optical routes.

The video camera 12 comprises a sensor 15, preferably consisting of a plurality of charge-coupled cells (CCD) arranged as a matrix. The sensor 15 is connected (in a manner not represented) to an electrical connector 16 for the electrical cable 7 with a view to delivering a video signal to the operating and control unit 8 in order to be displayed by the screen 10, the electrical connector 16 being mounted on the casing 11.

The casing 11 includes an internal compartment 11a which contains the illumination source 14 emitting in a spectrum having at least partial overlap with the visible-light spectrum.

In order to simplify the following description, reference will be made to the white light emitted by the illumination source 14. The internal compartment 11a has a window provided with an optical lens 17 which directs the illumination light beam to a semi-transparent plate 18 arranged between the objective 13 and the sensor 15 of the camera 12, so that the illumination light beam follows the optical path of the camera, that is to say the optical axis 13a of the objective 13. A first light trap 19, in the form of a plate, is placed behind the semi-transparent plate 18 with a view to absorbing the portion of the illumination light beam which has passed through the semi-transparent plate 18, and thus to reducing the optical disturbance in the monitoring unit 4.

The compact casing 11 of the monitoring unit 4 thus contains the video camera 12 with the illumination source 14 for emitting a light beam emitted by the illumination source 14 along an optical path coinciding with the optical axis 13a of the objective 13 of the camera 12. The light beam is sent by the monitoring unit 4 through the objective 13 and the window 3 of the processing chamber 1, to reach the sample 2 of thin-film structure. The light beam reflected by the sample 2 follows the same optical path as the incident light beam and passes through the objective 13 (FIG. 1) to enter the casing 11 of the monitoring unit 4. The semi-transparent plate 20 splits the reflected light beam into two parts. A transmitted part, after having passed through the semi-transparent plates 20 and 18, reaches the sensor 15 of the camera 12. The part reflected by the plate 20 reaches a fibre-optic cable 6, via an optical connector 22 mounted on the casing 11 of the monitoring unit 4.

The reflected beam, directed towards the sensor 15 of the camera 12, corresponds to the spectrum of the illumination light beam. In order to avoid dazzling the sensor 15 and therefore the video camera 12, a filter 23 is arranged in the optical path of the camera 12, just in front of the sensor 15. The optical filter 23 is transparent for a characteristic wavelength band and opaque for the other wavelengths, so as to allow only filtered light to pass through to the sensor 15 of the camera 12. The characteristic wavelength can be selected in order to eliminate the effect on the signal of the light from the sources present in the chamber 1, for example light from the etching plasma, generally in the ultraviolet range, and thus favour the light from the illumination beam, generally in the visible or infrared range. On the other hand, this characteristic wavelength band may be selected in order to accentuate the effect on the signal of an intensity modification of the reflected light due, for example, to the interaction of the plasma with a chemical species which is present in one layer but not in another, in order to detect the crossing of a layer. Each CCD cell of the sensor 15 represents one pixel in the image plane of the camera 12. The result of this is that the video camera 12 delivers a video signal, the display of which on the screen 10 corresponds to a representation of the surface morphology of the illuminated localized region of the sample 2.

The optical connector 22 receives a part of the reflected beam, in order to send it to the operating and control unit 8 by the fibre-optic cable 6. The connector 22 includes a selection diaphragm 22a, the aperture of which is predetermined or made adjustable in order to determine an image plane corresponding only to a part of the illuminated localized region of the sample 2, for analysis purposes.

FIGS. 3a to 3c schematically show some representative images of the method of the invention. The sample 2 to be processed is a thin-film structure used for the fabrication of integrated circuits by etching. The sample 2 comprises a silicon substrate 24, a sublayer 25 covering the substrate 24, and a silicon oxide surface layer 26 in which the integrated circuit will be etched. To this end, some parts of the surface layer 26 are protected by a mask 27. That region 26a of the surface layer 26 which is not protected by the mask 27 is attacked by a plasma process, known per se, until a given layer is crossed.

The incident light beam emitted by the monitoring unit 4 illuminates a localized region 2a on the upper surface of the sample 2. The localized region 2a is delimited by a white-light illumination light beam 28.

As described above, the morphology of the illuminated localized region 2a of the sample 2 (limited by the working area of the camera) is analysed in real time by the video camera 12 and displayed simultaneously on the screen 10. The morphology of the illuminated localized region 2a, and its change as a function of time, can therefore be monitored in real time before and during the process of plasma etching the sample 2.

The operating and control unit 8 contains an optical disperser, for example a prism, or an interference filter and a photodetector, or else a monochromator 8a, the operation of which (illustrated in FIG. 4) will be described hereafter. In order to be representative, the light beam sent to the monochromator 8a for the purposes of analysis should be limited to a specific region 29 (FIG. 3b) which is representative of the sample 2. Plasma etching of the sample 2 requires the unprotected part 26a of the surface layer 28 to be monitored in order to detect the crossing from one layer to another. It is then necessary for the specific analysis region 29 to lie inside the part 26a while excluding the parts covered by the mask 27. The specific analysis region 29 is delimited by the selection diaphragm 22a at the input of the optical connector 22. The aperture of the selection diaphragm 22a is determined as a function of the magnification of the objective 13, of the distance between the objective 13 and the exposed region 26a of the surface layer 26 of the sample 2, and of the signal-to-noise ratio of the signal output by the monochromator 8a. The image, defined by the analysis slit 30, received by the monochromator 8a corresponds to a known analysis point on the sample 2.

FIG. 3c illustrates the aperture 23a of the selection diaphragm 22a and an analysis slit 30 at the input of the monochromator 8a. Between the selection diaphragm 22a and the analysis slit 30 is the fibre-optic cable 6 which makes it possible to convey to the monochromator 8a the light beam reflected by the specific analysis region 29 of the sample 2.

As illustrated in FIG. 4, the light beam which has entered the monochromator 8a through the analysis slit 30 is projected onto a plane-field diffraction grating 31 and a photosensitive element 32 which may be in the form of an array consisting of a plurality (for example 1024) of photodiodes, CCD n-diodes or a CCD diode matrix with m rows and n columns. For a CCD diode array in which each diode has a size of 25 µm×25 µm, the analysis slit may be chosen to be slightly greater than or equal to 25 µm×25 µm.

The photosensitive element 32 gives the light intensity for each wavelength λ in the spectrum of the illumination light beam. The spectrum analyzed is limited by a minimum wavelength $\lambda_1$ and a maximum wavelength $\lambda_2$. Spectral analysis allows precise detection of the crossing of a discontinuity in the material, that is to say the crossing of a layer of the exposed part 26a of the surface layer 26 of the sample 2.

simultaneously with or consecutively to the spectral analysis, reflectometry is performed for a predetermined wavelength band chosen in the illumination spectrum. A variation in light intensity for this predetermined band makes it possible to detect a discontinuity in the material of the exposed part 26a of the surface layer 26 of the sample 2 during the plasma etching process.

By virtue of the invention, it is possible to monitor in real time the absolute thickness (by spectral analysis) and detect a discontinuity (by reflectometry) of the unprotected region 26a of the surface layer 26 of the sample 2 during the plasma etching process, for example, and to simultaneously display the morphology of the localized region 2a on the sample 2.

Of course, the invention applies to other vacuum processing of thin-film structures for in situ, real-time monitoring of the morphology, thickness and layer crossing in the surface layer of the sample to be processed.

FIG. 5 schematically shows a variant of the device described above, in the case when the standard monitoring unit 4 is not sufficient to fulfill its role, in particular when the wavelengths used are incompatible with the optical properties of the components (objective of the camera, semi-transparent optical plates) or when there is a lack of analysis sensitivity or absorption by the material analyzed. In those extreme cases, an additional module 33 is mounted on the casing 11 of the standard monitoring unit 4.

The additional module 33 operates in parallel as a complement to the unit 4. It is, for example, possible to use an illumination source employing a high-luminance xenon arc which emits a continuum in the ultraviolet. The use of such a source may be incompatible with the standard unit 4, because of its high heat emission and its incompatibility with the objective 13 of the camera 12. The xenon illumination source contained in the additional module 33 sends an additional illumination light beam in the ultraviolet light spectra (wavelength between 200 and 450 nm). The additional illumination beam passes through a special quartz objective 34 and is projected on the sample to be analyzed with the aid of the semi-transparent optical plates 35 and 36. The standard monitoring unit 4 also sends a light beam, as described above, onto the sample to be analyzed via the semi-transparent plate 36 which following the same optical path as the additional illumination beam. The reflected light beam is split into one part for the standard monitoring unit 4 and another part for the additional module which, via an optical connector (not represented), is connected to the fibre-optic cable 6 which is dis-connected from the optical connector 22 of the standard monitoring unit 4 (FIG. 2). The monochromator then performs the spectral analysis in the ultraviolet light spectrum, as described above.

FIG. 6 schematically shows a second embodiment of the invention, used when the localized region to be monitored is of small size, for example less than 1 mm in the image plane. In this case, the photodetector described above does not receive enough power from the light source 14. To solve this problem, the power required for the measurement is delivered by an additional source and conveyed by an optical fibre whose characteristics and, in particular, core diameter are chosen in accordance with the diameter of the region to be studied, the set of objectives and the distance from the camera to the sample.

In this embodiment, the casing 11 furthermore comprises a tube 37 containing an optical fibre 38 which can emit an intense light beam projected via a semi-transparent plate 39 onto the semi-transparent plate 20 interposed in the optical path between the objective 13 and the sensor 15 of the camera 12, so that the light beam output by the optical fibre 38 also follows the optical path of the camera 12, which coincides with the optical axis 13a of the objective 13. Another light trap 21, in the form of a plate, is arranged behind the semi-transparent plate 20 with a view to absorbing the stray light beams in the casing 11 of the monitoring unit 4. The input of the optical fibre 38 is illuminated by a point source 40, for example a xenon arc whose light is reflected, in known fashion, by a concave mirror which concentrates the light beam at the input of the optical fibre 38. The high luminance of the beam makes it possible to see an intense light spot which stands out from the illumination function of the sample 2. The core diameter of the optical fibre 38 fixes the diameter of the spot on the sample 2, for example 100 µm. Such a light beam permits precise binary detection of the crossing of a layer by the camera 12, one or more pixels of which correspond to the reduced region illuminated by the optical fibre 38, that is to say to the core diameter of the optical fibre 38. The detection may also be made using an optical disperser, the observation wavelength being chosen between 420 and 840 nm in order to benefit from the better optical transmission.

By virtue of the invention, the etching of the surface layer of a thin-film structure can be monitored in precise fashion and the instant when the following layer is reached can be detected by analysing the intensity of the reflected light flux. Such a method makes it possible to obtain an excellent signal-to-noise ratio by virtue of the intense point illumination produced by the optical fibre.

I claim:

1. Method for real-time, in situ monitoring of the morphology of a localized region during etching of the surface layer of a thin-film structure to detect transition to a following layer, said method utilizing a video camera which has a matrix sensor and an objective, said objective having an optical axis, the thin-film structure being enclosed in a vacuum processing chamber which includes a window on its upper wall, said method including the steps of:

sending an illumination light beam of predetermined spectrum onto the localized region, the beam following an optical path centred on the optical axis of the objective of a video camera and passing through the window of the processing chamber to reach the localized region;

sending the light beam reflected by the localized region, which follows the said optical path, on the one hand to the matrix sensor of the video camera through a filter whose characteristic wavelength is chosen so as to reduce the effect on the light signal of the sources present in the chamber other than the illumination light beam or to accentuate the effect on the signal of a light intensity modification by the sources present in the chamber and, on the other hand, to an optical disperser or interference filter, respectively and successively through a selection diaphragm and a fibre-optic cable;

performing, with the aid of the optical disperser or of the interference filter, a spectral analysis of the reflected light beam with a view to detecting the transition to the following layer, during etching, by reflectometry in a specific analysis region forming part of the localized region.

2. Monitoring method according to claim 1, characterized in that it consists in delimiting the specific analysis region by means of the aperture of the selection diaphragm so as to exclude, in the localized region, the parts not representative of the surface layer for analysis purposes.

3. Monitoring method according to claim 1, characterized in that it consists in simultaneously or successively performing the spectral analysis and the reflectometry of the light beam reflected by the specific analysis region.

4. Monitoring method according to claim 1, characterized in that it consists in emitting an illumination light beam in a spectrum which at least partially covers the visible light spectrum.

5. Monitoring method according to claim 1, characterized in that it consists in illuminating a reduced region by means of an optical fibre, the diameter of the core of the optical fibre defining the diameter of the reduced region on the thin-film structure, and in illuminating the input of the optical fibre with a point source, the luminance of the point source making it possible to see an intense light spot which stands out from the illumination beam, in order to perform binary detection of the transition from one layer to another.

6. Monitoring method according to claim 5, characterized in that the diameter of the core of the optical fibre is substantially equal to the size of a pixel of the camera.

7. A monitoring device for detecting, during etching in a vacuum chamber of a surface layer of a thin-film structure, the transition of the etching process from the surface layer to a following layer, comprising:

a monitoring unit which includes a compact casing containing a video camera having a matrix sensor and an optical axis which is directed toward a localized region of the thin-film structure, an illumination source having an optical path centered on the optical axis of the video camera, and optical components;

a filter located in the path of light reflected from the localized region of the film structure to the matrix sensor and having a characteristic wave length which reduces the effect of sources present in the chamber other than the illumination light beam or accentuates the effect of a light intensity modification by sources present in the chamber;

an operation and control unit for performing a spectral analysis of the reflected light beam and detecting by reflectometry in the localized region a transition to the following layer, said operation and control unit including an optical disperser or an interference filter;

an optical connector and an electrical connector mounted on the casing of the monitoring unit for connecting the monitoring unit respectively via a fibre-optic cable and an electrical cable to the operation and control unit;

a control keyboard and a display screen which are connected to the operation and control unit;

a selection diaphragm and a fibre-optic cable which transmit light reflected from the localized region of the thin-film structure to the optical disperser or the interference filter of the operations and control unit;

means for horizontally displacing the monitoring unit relative to the processing chamber along two axes in order to select the localized region and to provide precise positioning so that the light beams which are incident and reflected by the sample follow a common optical path.

8. Device according to claim 1, characterized in that the optical connector comprise a selection diaphragm which is removable or is adjustable in terms of aperture.

9. Device according to claim 1, characterized in that the operation and control unit is provided with a monochromator comprising a diode array and an input analysis slit whose aperture is slightly greater than or equal to the size of a diode in the array.

10. Device according to claim 1, characterized in that it comprises an additional module, mounted removably on the casing of the monitoring unit, making it possible to send an illumination light beam and/or a laser beam incompatible with the optical characteristics of the monitoring unit, semi-transparent optical plates being used for guiding the light beams output by the monitoring unit and by the additional module along a common optical route to the thin-film structure.

11. Device according to claim 1, characterized in that it comprises a tube containing an optical fibre, and a point light source intended to illuminate the input of the optical fibre so as to strongly illuminate a reduced region of the thin-film structure.

12. Device according to claim 7 wherein the operation and control unit is provided with a monochromator comprising a charge-coupled matrix.

* * * * *